United States Patent
Kalnitsky et al.

(10) Patent No.: US 6,380,571 B1
(45) Date of Patent: *Apr. 30, 2002

(54) CMOS COMPATIBLE PIXEL CELL THAT UTILIZES A GATED DIODE TO RESET THE CELL

(75) Inventors: Alexander Kalnitsky, San Francisco; Albert Bergemont, Palo Alto; Pavel Poplevine, Foster City, all of CA (US)

(73) Assignee: National Semiconductor Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/173,276

(22) Filed: Oct. 14, 1998

(51) Int. Cl.$^7$ .............................................. H01L 31/113
(52) U.S. Cl. ...................... 257/292; 257/290; 257/291; 257/443; 257/461
(58) Field of Search ................. 257/290, 291, 257/292, 431, 443, 444–445, 461

(56) References Cited

U.S. PATENT DOCUMENTS

| | | | |
|---|---|---|---|
| 4,491,746 A | 1/1985 | Koike | 307/296 R |
| 4,688,071 A * | 8/1987 | Tihanyi et al. | 357/41 |
| 4,791,317 A | 12/1988 | Winnerl et al. | 307/296 R |
| 4,812,668 A | 3/1989 | Gurnee | 250/578 |
| 5,394,026 A | 2/1995 | Yu et al. | 327/536 |
| 5,587,596 A | 12/1996 | Chi et al. | 257/223 |
| 5,608,243 A | 3/1997 | Chi et al. | 257/249 |
| 5,610,549 A | 3/1997 | Choi | 327/536 |
| 5,612,644 A | 3/1997 | Runas | 327/535 |
| 5,614,744 A * | 3/1997 | Merrill | 257/291 |
| 5,670,907 A | 9/1997 | Gorecki et al. | 327/535 |
| 5,694,072 A | 12/1997 | Hsiao et al. | 327/537 |
| 5,710,446 A | 1/1998 | Chi et al. | 257/225 |
| 5,841,126 A | 11/1998 | Fossum et al. | 250/208.1 |
| 5,952,872 A | 9/1999 | Hur | 327/535 |
| 6,043,525 A * | 3/2000 | Chen | 257/292 |
| 6,046,444 A * | 4/2000 | Afghahi | 250/208.1 |
| 6,078,211 A * | 6/2000 | Kalnitsky et al. | 327/534 |

OTHER PUBLICATIONS

Dickinson, A. et al, TP 13.5: A 256×256 CMOS Active Pixel Image Sensor with Motion Detection, TP 13:5, *IEEE* International Solid–State Circuits Conference (1995) pp. 226–227.

Kawashima, H., et al. "A 1/4 Inch Format 250K Pixel Amplified MOS Image Sensor Using CMOS Process," *IEEE*, 1993, pp. 575–578.

Mendis, S. et al. "Progress in CMOS Active Pixel Image Sensors," *SPIE*, vol. 2172, pp. 19–29.

* cited by examiner

Primary Examiner—Eddie Lee
Assistant Examiner—Bradley Wm. Baumeister
(74) Attorney, Agent, or Firm—Pillsbury Winthrop LLP

(57) ABSTRACT

The potential on a pixel cell having a gated diode and a read out transistor is set to an initial level prior to an image integration period. During the image integration period, absorbed photons cause the potential on the pixel cell to change. After the image integration period, the pixel cell is then reset and read out by applying a number of pulses to the gated diode. Each of the pulses causes a fixed amount of charge to be injected into the cell. When the potential on the cell has again returned to the initial level, the number of absorbed photons is determined by counting the number of pulses that were required to return the potential to the initial level. The read out transistor is used to determine when the potential is at the initial level by biasing the transistor to output a current that corresponds to the potential on the pixel cell.

30 Claims, 5 Drawing Sheets

CMOS COMPATIBLE PIXEL CELL THAT UTILIZES A GATED DIODE TO RESET THE CELL

RELATED APPLICATIONS

The present invention is related to application Ser. No. 09/173,096 for SUBSTRATE BIASING CIRCUIT THAT UTILIZES A GATED DIODE TO SET THE BIAS ON THE SUBSTRATE by Alexander Kalnitsky et al., which is filed on an even date herewith.

BACKGROUND OF THE INVENTION

1. Field of the Invention

The present invention relates to a CMOS compatible pixel cell and, more particularly, to a CMOS compatible pixel cell that utilizes a gated diode to reset the cell.

2. Description of the Related Art

Charge-coupled devices (CCDs) have been the mainstay of conventional imaging circuits for converting a pixel of light energy into an electrical signal that represents the intensity of the light energy. In general, CCDs utilize a photogate to convert the light energy into an electrical charge, and a series of electrodes to transfer the charge collected at the photogate to an output sense node.

Although CCDs have many strengths, which include a high sensitivity and fill-factor, CCDs also suffer from a number of weaknesses. Most notable among these weaknesses, which include limited readout rates and dynamic range limitations, is the difficulty in integrating CCDs with CMOS-based signal processors.

To overcome the limitations of CCD-based imaging circuits, more recent imaging circuits use active pixel sensor cells to convert a pixel of light energy into an electrical signal. With active pixel sensor cells, a conventional photodiode is typically combined with a number of active transistors which, in addition to forming an electrical signal, provide amplification, readout control, and reset control.

Figure 1:
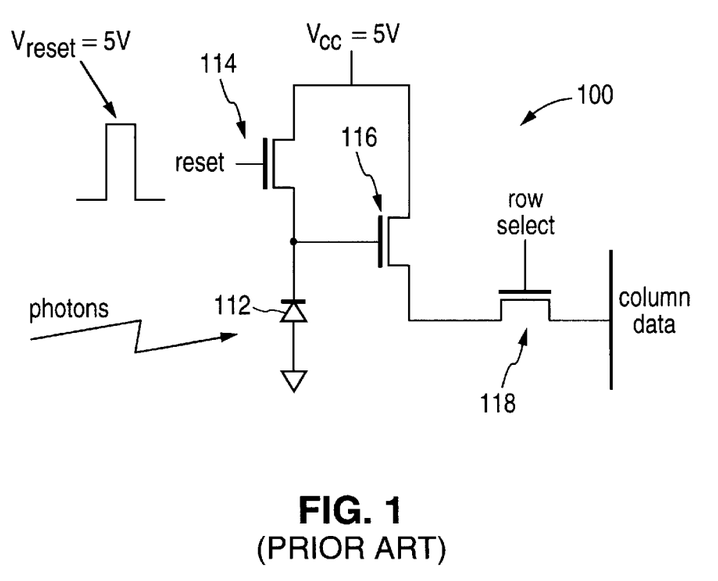
FIG. 1 is a schematic diagram illustrating a conventional active pixel sensor cell 100.

FIG. 1 shows an example of a conventional CMOS active pixel sensor cell 100. As shown in FIG. 1, cell 100 includes a photodiode 112, a reset transistor 114, whose source is connected to photodiode 112, a sense transistor 116, whose gate is connected to photodiode 112, and a select transistor 118, whose drain is connected in series to the source of sense transistor 116.

Operation of active pixel sensor cell 100 is performed in three steps: a reset step, where cell 100 is reset from the previous integration cycle; an image integration step, where the light energy is collected and converted into an electrical signal; and a signal readout step, where the signal is read out.

As shown in FIG. 1, during the reset step, the gate of reset transistor 114 is briefly pulsed with a reset voltage that turns on transistor 114 which, in turn, resets photodiode 112 to an initial integration voltage which is approximately equal to the voltage on the drain of transistor 114 less the threshold voltage of transistor 114.

During integration, light energy, in the form of photons, strikes photodiode 112, thereby creating a number of electron-hole pairs. Photodiode 112 is designed to limit recombination between the newly formed electron-hole pairs. As a result, the photogenerated holes are attracted to the ground terminal of photodiode 112, while the photogenerated electrons are attracted to the positive terminal of photodiode 112 where each additional electron reduces the voltage on photodiode 112.

Thus, at the end of the integration period, the number of photons which were absorbed by photodiode 112 during the image integration period can be determined by subtracting the voltage at the end of the integration period from the voltage at the beginning of the integration period.

Following the image integration period, active pixel sensor cell 100 is read out by turning on select transistor 118. At this point, the reduced voltage on photodiode 112, less the threshold voltage of sense transistor 116, is present on the source of sense transistor 116.

When select transistor 118 is turned on, the voltage on the source of sense transistor 116 is then transferred to the source of select transistor 118. The reduced voltage on the source of select transistor 118 is detected by conventional detection circuitry which includes analog-to-digital (A/D) converters.

Thus, active pixel sensor cell 100 provides a CMOS compatible alternative to CCD-based imagers. However, although active pixel sensor cell 100 is CMOS compatible, there is a need for other pixel cells which are CMOS compatible.

SUMMARY OF THE INVENTION

The present invention provides a pixel cell that, in addition to being CMOS compatible, utilizes a gated diode to reset the cell. By utilizing a gated diode to reset the cell, the present invention eliminates the need for A/D converters which are conventionally used in pixel cells.

A pixel cell in accordance with the present invention, which is formed in a semiconductor material of a first conductivity type, includes a first well of a second conductivity type which is formed in the semiconductor material, and a second well of the first conductivity type which is formed in the first well.

In addition, the pixel cell also includes a gated diode which is formed in the second well, a read out transistor which is formed in the second well, and a cell diode which is connected between the gated diode and ground. Further, the read out transistor is spaced apart from the gated diode.

The present invention also includes an imaging system, which is formed in a semiconductor material of a first conductivity type, that includes a pixel cell and a control circuit. The pixel cell includes a first well of a second conductivity type which is formed in the semiconductor material, and a second well of the first conductivity type which is formed in the first well.

The pixel cell also includes a gated diode which is formed in the second well, a read out transistor which is formed in the second well, and a cell diode which connected between the gated diode and ground. In addition, the read out transistor is spaced apart from the gated diode.

The control circuit includes an oscillator which is connected to the gated diode, a counter which is connected to the gated diode, and a controller which is connected to the oscillator, the gated diode, and the read out transistor.

The present invention further includes an imaging system, which is formed in a semiconductor material of a first conductivity type, that includes a plurality of pixel cells which are formed in rows and columns, and a plurality of row select lines which are connected to the pixel cells so that each row select line is connected to the pixels in a row of pixels.

The imaging system also includes a plurality of oscillator output lines which are connected to the pixel cells so that each oscillator output line is connected to the pixels in a row of pixels, and a plurality of read out lines which are connected to the pixel cells so that each read out line is connected to the pixels in a column of pixels.

The imaging system additionally includes a plurality of counters which are arranged so that a counter corresponds with each column of pixel cells, and a counter output line which is connected to each counter. Further, a plurality of control lines are connected to the counters so that each control line is connected to a counter, and an oscillator/controller is connected to the row select lines, the oscillator output lines, the read out lines, the counter output line, and the control lines.

The pixel cell of the present invention is operated by setting a potential on the second well to a first level. A plurality of photons are then collected in the first and second wells. The plurality of photons changes the potential on the second well to a second level.

A number of pulses are next applied to the gated diode until the potential on the second well returns to the first level. The number of pulses applied to the gated diode that are required to return the potential on the second well to the first level are counted to determine the number of absorbed photons.

The second imaging system of the present invention is operated by selecting via the controller a row of pixel cells to be read out, and then applying a row select voltage to the row select line that corresponds with the row of pixel cells to be read out.

A number of pulses are next applied to the oscillator output line that corresponds with the row of cells to be read out. The pulses change a potential on each of the cells to be read out. The number of pulses required to set the potential of each cell to a first level is counted to determine the number of photons absorbed by each cell.

A better understanding of the features and advantages of the present invention will be obtained by reference to the following detailed description and accompanying drawings which set forth an illustrative embodiment in which the principals of the invention are utilized.

DETAILED DESCRIPTION

Figure 2:
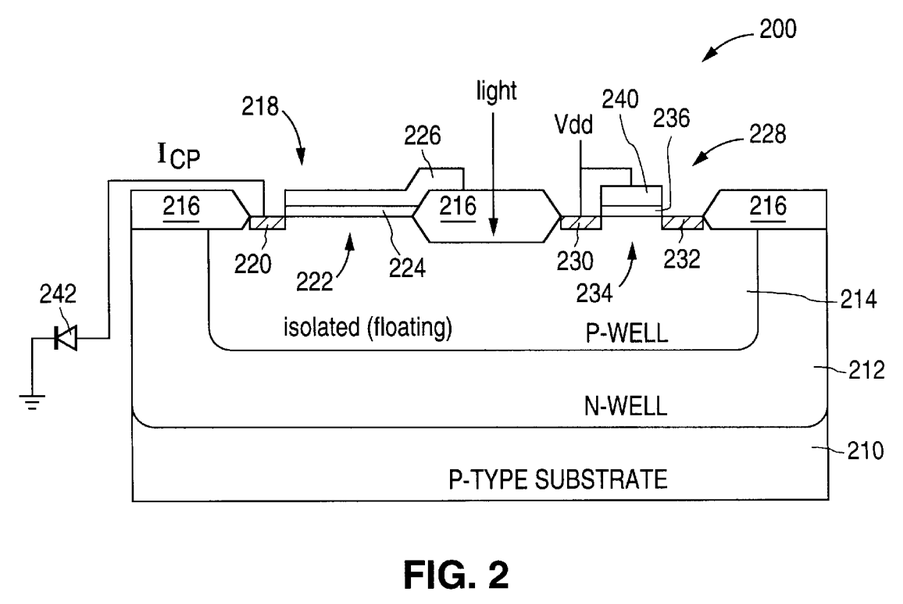
FIG. 2 is a cross-sectional drawing illustrating a CMOS compatible pixel cell 200 in accordance with the present invention.

FIG. 2 shows a cross-sectional drawing that illustrates a CMOS compatible pixel cell 200 in accordance with the present invention. As described in greater detail below, the present invention resets pixel cell 200, reads out a charge representative of the number of absorbed photons from cell 200, and digitizes the value of the charge all at the same time by injecting discrete amounts of charge into the pixel.

As shown in FIG. 2, pixel cell 200, which is formed in a p-type material 210, such as a substrate, includes a n-well 212 which is formed in substrate 210, and a p-well 214 which is formed in n-well 212. In addition, cell 200 also includes a plurality of field oxide regions 216 which are formed in p-well 214, and a gated diode 218.

Gated diode 218, in turn, includes a n+ diffusion region 220 which is formed in p-well 214, and an inversion region 222 which is defined in p-well 214 between an oxide region 216 and diffusion region 220. In addition, gated diode 218 also includes a layer of oxide 224 which is formed over inversion region 222, and a diode gate 226 which is formed on oxide layer 224 over inversion region 222.

As further shown in FIG. 2, cell 200 additionally includes a read out transistor 228. Transistor 228, in turn, includes a n+ drain region 230 which is formed in p-well 214, a n+ source region 232 which is formed in p-well 214, and a channel region 234 which is defined in p-well 214 between drain and source regions 230 and 232.

In addition, read out transistor 228 also includes a layer of gate oxide 236 which is formed over channel region 234, and a read out gate 240 which is formed over gate oxide layer 236. Further, cell 200 additionally includes a cell diode 242 which is connected between diffusion region 220 and ground.

Figure 3:
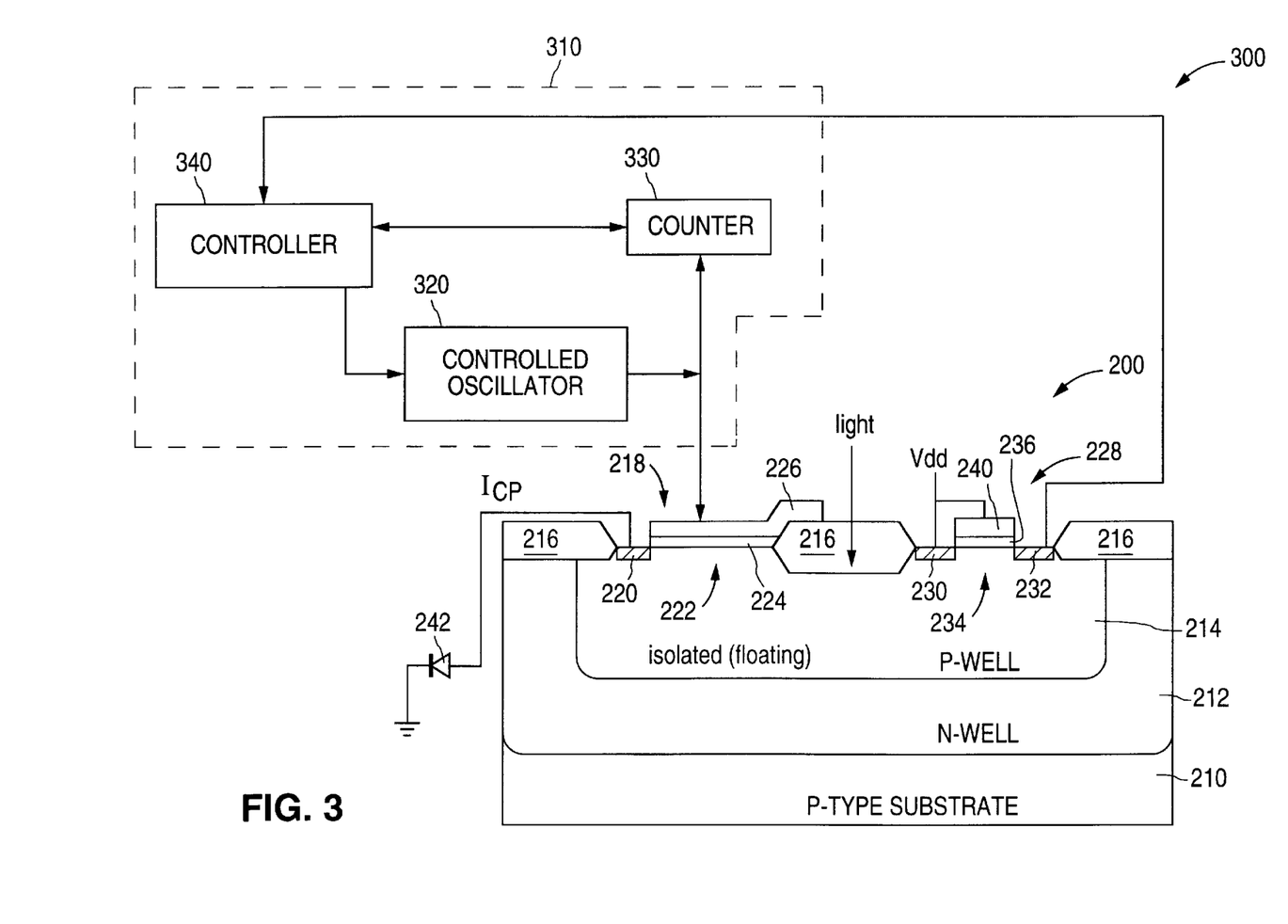
FIG. 3 is a cross-sectional and schematic diagram illustrating an imaging system 300 in accordance with the present invention.

FIG. 3 shows a cross-sectional and schematic diagram that illustrates an imaging system 300 in accordance with the present invention. As shown in FIG. 3, system 300 includes pixel cell 200 and a reset/read out circuit 310 which is connected to pixel cell 200.

As shown in FIG. 3, reset/read out circuit 310 includes a controlled oscillator 320 that outputs a series of pulses to diode gate 226. In addition, circuit 310 also includes a counter 330 which counts the number of pulses output by oscillator 320, and a controller 340 which controls oscillator 320 and counter 330.

The operation of system 300 is performed in two steps: an image integration step, where light energy is collected and converted into an electrical charge during an integration period, and a read out/reset step, where the electrical charge is read from cell 200 while cell 200 is simultaneously reset for the next integration cycle.

During the operation of system 300, drain region 230 and gate 240 of read out transistor 228 are biased to a positive voltage Vdd, while n-well 212 is biased to ground. P-well 214, on the other hand, is allowed to float.

As described in greater detail below, the integration step begins after the potential on p-well 214 has been lowered to an initial level which is defined as the level where substantially no charge flows into p-well 214 via diode 242 when a positive pulse is applied to diode gate 226.

Lowering the potential on p-well 214 has the same effect as increasing the threshold voltage of read out transistor 228. Thus, when the potential on p-well 214 is lowered to the initial level, the threshold voltage of transistor 228 is raised to a first level.

With the threshold voltage of transistor 228 raised to the first level, the bias voltage Vdd applied to drain region 230 and gate 240 is set to a voltage level which allows substantially no current to flow out of source region 232. Thus, when the potential on p-well 214 is lowered to the initial level, the threshold voltage of transistor 228 is raised to the point where substantially no current flows out of source region 232. (Although increased power consumption results, the bias voltage Vdd may alternately be set to allow any level of current flow when the potential on p-well 214 is equal to the initial level).

During the integration period, light energy, in the form of photons, strikes the lattice in p-well 214 and n-well 212, thereby forming a number of electron-hole pairs. P-well 214 and n-well 212 are designed to limit recombination between the newly formed photogenerated electron-hole pairs.

As a result, the photogenerated electrons formed in p-well 214 diffuse over and are collected by n-well 212, while the photogenerated electrons formed in n-well 212 remain in n-well 212. Similarly, the photogenerated holes formed in n-well 212 diffuse over and are collected by p-well 214, while the photogenerated holes formed in p-well 214 remain in p-well 214.

Thus, due to the absorbed photons, more holes are present in p-well 214 at the end of the integration period than were present at the beginning of the integration period. The increased number of holes, in turn, increases the potential on p-well 214.

As a result, the number of photons which were absorbed during the image integration period can be determined by determining the change in potential on p-well 214. In accordance with the present invention, the change in potential on p-well 214 is determined by measuring the charge required to again lower the potential on p-well 214 to the initial level.

The potential on p-well 214 is again lowered to the initial level by applying a series of positive pulses to diode gate 226. (Since the positive pulses are applied to a gate, the positive pulses may be generated by on-board charge pumps as the charge pumps do not need to sustain a large current flow.)

Specifically, at the end of the integration step, the read out/reset step begins with controller 340 commanding counter 330 to reset the count held by counter 330. Once the count has been reset, controller 340 commands oscillator 320 to output a series of positive pulses.

When gate 226 is pulsed positive, a positive potential is capacitively coupled to the surface of p-well 214 which, in turn, lowers the potential barrier across the n+ diffusion region 220 to p-well 214 junction.

As a result, electrons flow from ground through diode 242 to n+ diffusion region 220 where the electrons are injected into p-well 214 to form an inversion layer in inversion region 222. At the same time, mobile holes flow from p-well 214 through diffusion region 220 and diode 242 to ground.

When the voltage on gate 226 is returned to ground, the electrons in p-well 214 (except for the electrons that are within a diffusion length of the junction depletion region) are forced to recombine with the majority carriers (holes) in p-well 214 (diode 242 prevents the electrons from returning to ground).

As a result, the holes lost to recombination no longer have a net positive charge which, in turn, is equivalent to removing a number of holes from p-well 214. This loss of holes causes the potential on p-well 214 to be lowered.

The negative charge Qi injected into p-well 214 during a pulse (the steady-state charge in the inversion layer) is given by EQ. 1 as:

$$Qi = Cox * \text{Area} * (Vg - Vt) \quad \text{EQ. 1}$$

where Cox is the gate oxide capacitance per unit area, Area is the diode gate area, Vg is the diode gate voltage pulse amplitude, and Vt is the threshold voltage of gated diode 118.

When a series of positive pulses are used, the above-described process is repeated for each positive pulse which gives rise to a charge pumping current Icp which is given by EQ. 2 as:

$$Icp = f * Qi \quad \text{EQ. 2}$$

where f is the frequency of the series of positive pulses. The linear relationship between the frequency f and the charge pumping current Icp exists if the frequency f is sufficiently low for effective complete recombination of charge Qi to occur between pulse applications. The linear relationship holds up to frequencies of several megahertz at room temperature.

For a given amplitude of the pulsed signal, the charge pumping current Icp will increase with increasing temperature. In addition, the linear relationship will be extended due to enhanced charge recombination that occurs with increasing temperature.

The desired magnitude of the charge injection per pulse is achieved by appropriately sizing inversion region 222 (including gate 226) and selecting the amplitude of the pulse signal. The negative charge Qi injected into p-well 214 is illustrated in FIG. 4.

Figure 4:
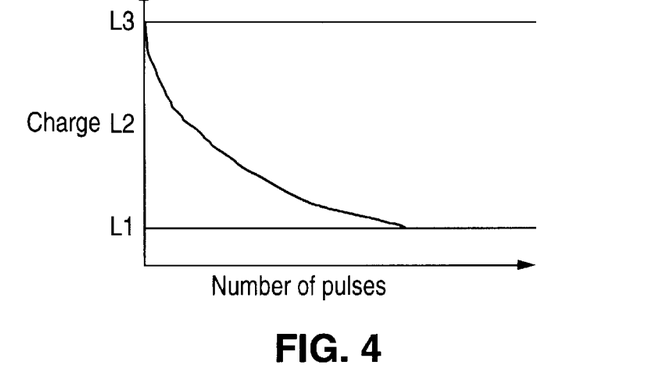
FIG. 4 is a graph illustrating the number of pulses versus the charge on a cell in accordance with the present invention.

As shown in FIG. 4, more pulses are required to reduce the potential on p-well 214 from an intermediate level L2 to an initial level L1 than are required to reduce the potential from a maximum level L3 to the intermediate level L2. The maximum level L3 is defined as the level where the p-well 214 to n-well 212 junction becomes forward biased.

The maximum charge which can be injected into p-well 214 is self limiting in that once the potential on p-well 214 has been lowered to the initial level, the threshold voltage of gated diode 218 rises to the level of the positive pulse.

As a result, the formation of the inversion charge is no longer possible and the process stops. Thus, once the maximum charge has been injected, additional pulses have no significant effect, and there is substantially no charge flowing through diode 242.

Controller 340 determines when the potential on p-well 214 has again been lowered to the initial level by sensing the current that flows through read out transistor 228. Since the potential on p-well 214 is greater than the initial level at the end of the integration period due to the increased number of holes, the threshold voltage of read out transistor 228 is effectively lowered.

This lowering of the threshold voltage, in turn, allows a read out current (or a larger read out current if the bias voltage Vdd is set to allow some current flow when the potential is at the initial level) to flow out of source region 232 of read out transistor 228.

In the embodiment of FIG. 3, the read out current is largest when the potential on p-well 214 is approximately zero volts since n-well 212 is biased to ground. Larger potentials on p-well 214 will cause the p-well to n-well junction to become forward biased which, in turn, provides cell 200 with automatic antiblooming.

However, once n pulses have been applied to diode gate 226, the potential on p-well 214 will be lowered to again be equal to the initial level. This lowering of the potential on p-well 214 causes the read out current to substantially stop (or return to the level that flows when the potential is equal to the initial level).

As noted above, once the potential has been lowered to the initial level, additional pulses have substantially no effect. Thus, when the read out current substantially stops, controller 340 commands counter 330 to stop counting, and oscillator 320 to stop outputting the pulses. Controller 340 then reads the count from counter 330.

The total charge Tc injected into p-well 214 to again lower the potential to the initial level is defined by EQ. 3 as:

$$Tc = n * Qi \quad \text{EQ. 3}$$

where n represents the number of pulses that were applied to lower the potential to the initial level. Knowing the total charge Tc, in turn, allows controller 340 to determine (or look up) the number of collected photons.

As noted above in EQ. 1, a fixed amount of negative charge Qi is injected into p-well 214 with each pulse. Thus, a varying amount of negative charge will be injected into p-well 214 on the last pulse, depending on how much additional charge is needed to lower the potential to the initial level.

For example, if each pulse prior to reaching the initial level causes 100 electrons to be injected into p-well 214, and if prior to the last pulse only 60 electrons are needed to reach the initial level, then during the last pulse only 60 of the 100 available electrons will be injected into p-well 214.

Since counter 330 counts the last pulse regardless of how many electrons are injected into p-well 214, counter 330 functions as a digitizer. The number of pulses that are required to cover the entire dynamic range of the potential on p-well 214, which ranges from the initial level at the lower end to the maximum level (which causes the p-well 214 to n-well 212 junction to become forward biased), may be set to any number to obtain the desired precision. In addition, the pulse amplitude may also be varied to vary the precision.

Thus, one of the advantages of the present invention is that relatively simple counters can be used in lieu of the more complicated A/D converters that are traditionally used with pixel cells while at the same time providing an equivalent level of precision.

The absolute value of the maximum initial level of the potential on p-well 214 is approximately equivalent to a back bias voltage Vbb, and can be estimated using the following equations:

$$V_t = V_{to} + k * SQRT(|Vbb|) \quad \text{EQ. 4}$$

$$V_g - V_t = V_g - V_{to} - k(Vbb)^{0.5} = 0 \quad \text{EQ. 5}$$

$$Vbb = (1/k * [V_g - V_{to}])^2 \quad \text{EQ. 6}$$

where $V_t$ is the threshold voltage of the gated diode, $V_{to}$ is the threshold voltage at zero volts back bias, k is the back bias coefficient, and $V_g$ is the diode gate voltage.

Thus, EQ. 6 suggests that in modern MOS technologies, where k is less than one and $V_{to}$ is approximately 0.4–0.7V, the absolute value of the maximum initial level of the potential on p-well 214 may be as high as or in excess of the power supply voltage.

In a realistic circuit implementation, the injection of negative charge into p-well 214 is competing against the discharge of p-well 214 by the thermally generated leakage current flowing from n-well 216 to p-well 214. However, an appropriate choice of the diode gate signal frequency, and the gated diode area relative to the area of p-well 214 will always result in the maximum attainable Vbb level.

Figure 5:
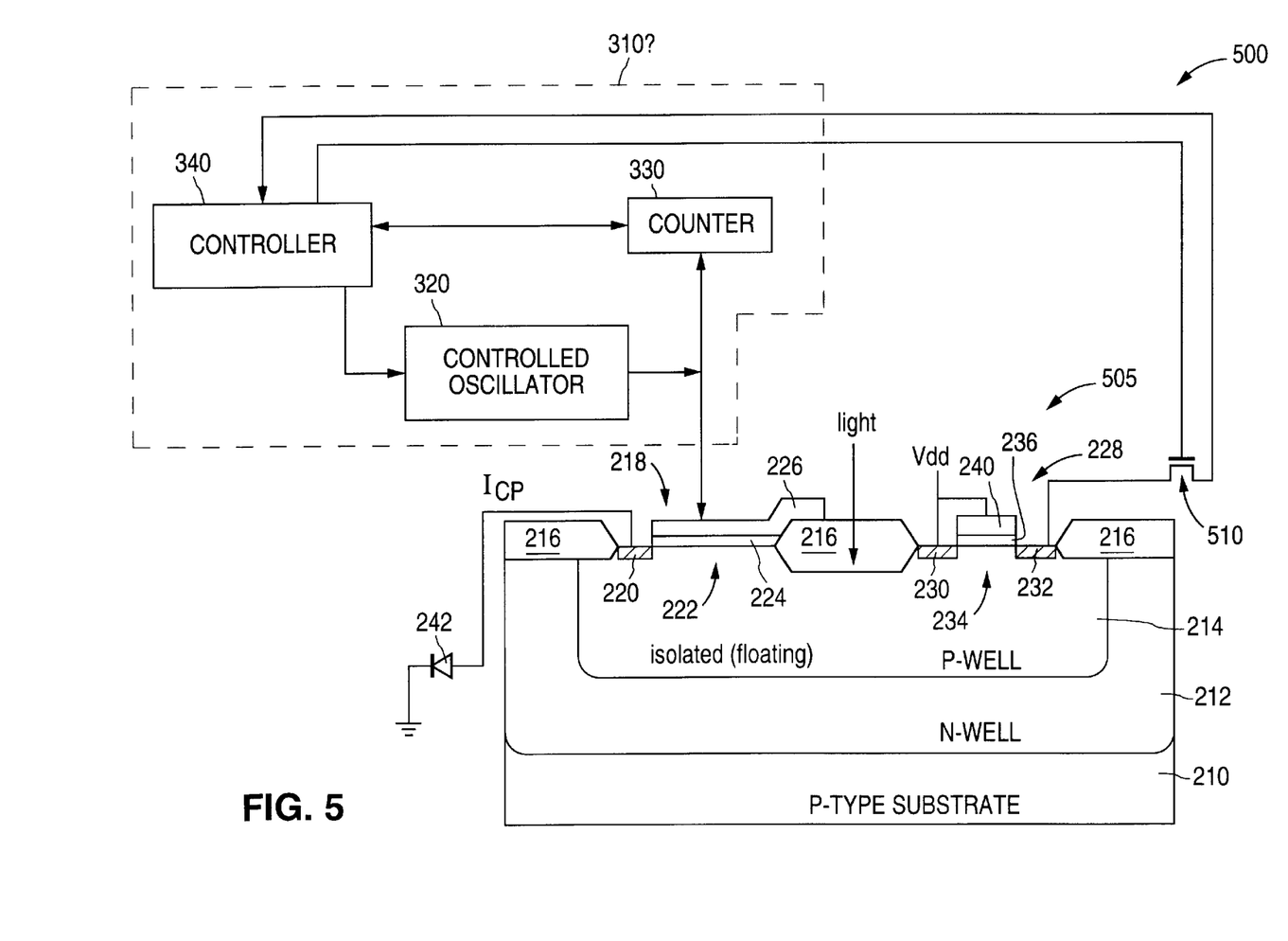
FIG. 5 is a cross-sectional and schematic diagram illustrating an imaging system 500 in accordance with the present invention.

FIG. 5 shows a cross-sectional and schematic diagram that illustrates an imaging system 500 in accordance with the present invention. System 500 is similar to system 300 and, as a result, utilizes the same reference numerals to designate the structures which are common to both cells.

As shown in FIG. 5, system 500 differs from system 300 in that system 500 includes a pixel cell 505 that differs from pixel cell 200 in that cell 505 includes a select transistor 510 which is connected to source region 232 of transistor 228. One of the advantages of cell 505 is that select transistor 510 prevents current from flowing out of source region 232 during the image integration step as the potential on p-well 214 begins to rise in response to the absorbed photons.

Figure 6:
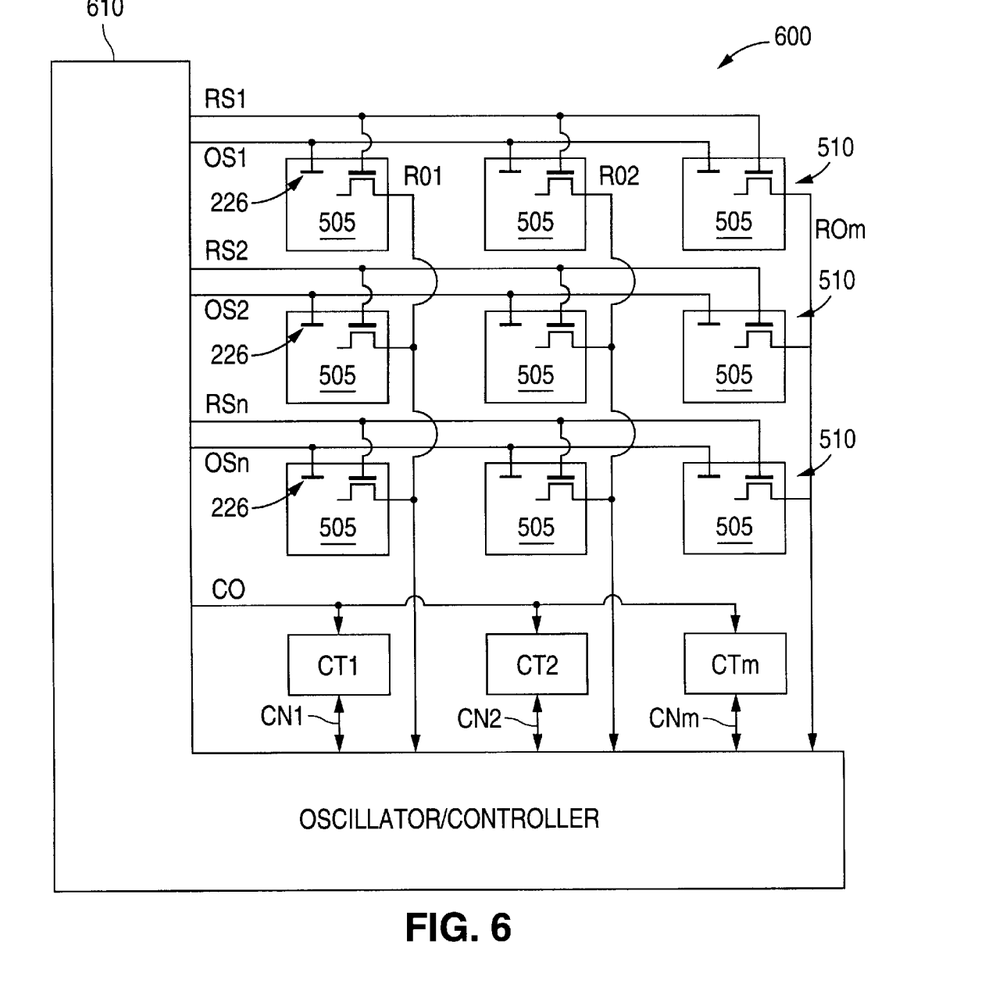
FIG. 6 is a cross-sectional and schematic diagram illustrating a multi-pixel imaging system 600 in accordance with the present invention.

FIG. 6 shows a cross-sectional and schematic diagram that illustrates a multi-pixel imaging system 600 in accordance with the present invention. As shown in FIG. 6, system 600 includes a plurality of pixel cells 505 which are arranged in rows and columns.

In addition, system 600 further includes a plurality of row select lines RS1–RSn which are connected to cells 505 such that each row select line RS is connected to the cells 505 in a row of cells 505. Specifically, each row select line RS is connected to the gates of the select transistors 510 in a row of cells 505.

System 600 also includes a plurality of read out lines RO1–ROm which are connected to cells 505 such that each read out line RO is connected to the cells 505 in a column of cells 505. Specifically, each read out line RO is connected to the sources of the select transistors 510 in a column of cells 505.

System 600 further includes a plurality of oscillator output lines OS1–OSn which are connected to cells 505 such that each oscillator output line OS is connected to the cells 505 in a row of cells 505. Specifically, each oscillator output line OS is connected to the diode gates 226 in a row of cells 505.

As further shown in FIG. 6, system 600 additionally includes a plurality of counters CT1–CTm which are arranged such that each column of cells 505 has a corresponding counter CT, a counter oscillator line CO which is connected to each counter CT, and a plurality of control lines CN1–CNm which are connected to the counters CT1–CTm such that each control line CN is connected to a counter CT.

System 600 also includes an oscillator/controller 610 which is connected to each row select transistor 510 via row select lines RS1–RSn and read out lines RO1–ROm, each counter CT via counter oscillator line CO and control lines CN1–CNm, and the diode gate 126 of each cell 505 via oscillator output lines OS1–OSn.

In operation, the image information collected by pixel cells 505 is read out row by row by controller 610. Thus, for example, if controller 610 selects row one to be read out, controller 514 commands each of the counters CT to reset the count, outputs a series of pulses on oscillator output line OS1 and counter oscillator line CO, and raises the voltage on row select line RS1.

Once the read out current on a read out line RO substantially stops, controller 610 commands the corresponding counter to stop counting. For example, if the current on read out line RO1 substantially stops while the current on read out lines RO2–ROm continues to flow, controller 610 commands counter CT1 to stop counting while allowing counters CT2–CTm to continue counting.

After all of the counters CT1–CTm have stopped counting, controller 610 lowers the voltage on row select line RS1, and reads out the count associated with each cell 505 in the first row. The same process is repeated until each row of cells have been read out.

Figure 7:
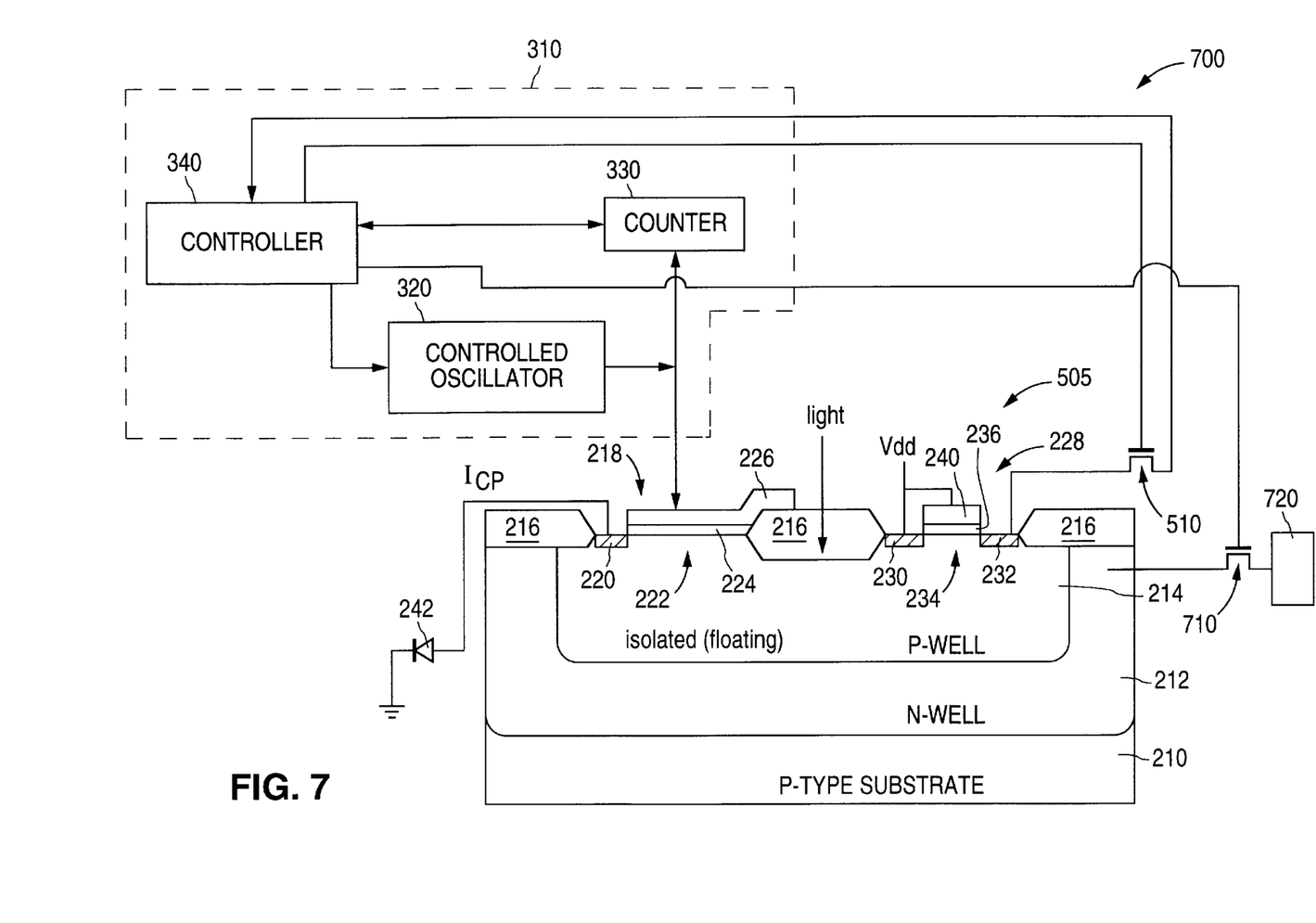
FIG. 7 is a cross-sectional and schematic diagram illustrating an imaging system 700 in accordance with the present invention.

FIG. 7 shows a cross-sectional and schematic diagram that illustrates an imaging system 700 in accordance with the present invention. System 700 is similar to system 500 and, as a result, utilizes the same reference numerals to designate the structures which are common to both cells.

As shown in FIG. 7, system 700 differs from system 500 in that system 700 also includes a reset transistor 710 which is used to gate p-well 214 to a variable voltage source 720. Reset transistor 710 provides a means for auto-calibration in that the potential on p-well 214 can be set to the maximum level by setting variable voltage source 720 to ground and momentarily connecting p-well 214 to ground.

In addition, the potential can be set to the intermediate level by setting variable voltage source 720 to an intermediate voltage level. The number of pulses required to bring the potential on p-well 214 can then be calibrated by counting the number of pulses required to return the potential to the initial level. This calibration yields parameters needed to carry out the number-of-pulses to the amount-of-absorbed-light conversion in the post processor.

Further, when a plurality of cells 505 are arranged in rows and columns, the current provided by the cells when the potential is at the initial level can be calibrated by shielding a pixel cell 505.

In further accordance with the present invention, when sets of pixels which are formed to respond to red, green, or blue light are read out, the resolution of the pixels can be increased by reading the red pixels out at the frequency corresponding to red light, the green pixels out at the frequency corresponding to green light, and the blue pixels out at the frequency corresponding to blue light.

In addition, as noted above, the precision may also be varied by varying the number of pulses required to cover the dynamic range of the potential on p-well 214, and by varying the amplitude of the pulses applied to the diode gate.

It should be understood that various alternatives to the embodiment of the invention described herein may be employed in practicing the invention. For example, in addition to using a p-well which is fabricated in an isolating n-well which, in turn, in formed in a p-substrate, the p-well can also be formed in a n-substrate.

In addition, a n-well can be formed in a p-substrate, or in an isolating p-well which, in turn, is formed in a n-substrate. Further, an NMOS gated diode or a PMOS gated diode can be formed in a silicon island that is completely surrounded by a dielectric (e.g., SOI technology).

Thus, it is intended that the following claims define the scope of the invention and that methods and structures within the scope of these claims and their equivalents be covered thereby.

What is claimed is:

1. A pixel cell formed in a semiconductor material of a first conductivity type, the cell comprising:
    a first well of a second conductivity type formed in the semiconductor material;
    a second well of the first conductivity type formed in the first well;
    a gated diode formed in the second well; and
    a read out transistor formed in the second well, the read out transistor being spaced apart from the gated diode; and
    a cell diode connected between the gated diode and ground.

2. The cell of claim 1 wherein the gated diode includes:
    a diffusion region of the second conductivity type formed in the second well;
    an inversion region defined in the second well, the inversion region adjoining the diffusion region;
    a layer of oxide formed over the inversion region; and
    a diode gate formed on the layer of oxide layer.

3. The cell of claim 2 wherein the read out transistor includes:
    spaced-apart source and drain regions formed in the second well, the source and drain regions being spaced apart from the diffusion region and the inversion region;
    a channel region defined in the second well between the source and drain regions;
    a layer of gate oxide formed over the channel region; and
    a read out gate formed on the layer of gate oxide over the channel region.

4. The cell of claim 2 wherein the cell diode is connected between the diffusion region and ground.

5. An imaging system formed in a semiconductor material of a first conductivity type, the system comprising:
    a pixel cell having:
        a first well of a second conductivity type formed in the semiconductor material;
        a second well of the first conductivity type formed in the first well;
        a gated diode formed in the second well; and
        a read out transistor formed in the second well, the read out transistor being spaced apart from the gated diode; and
        a cell diode connected between the gated diode and ground; and
    a control circuit having:
        an oscillator connected to the gated diode;
        a counter connected to the gated diode; and
        a controller connected to the oscillator, the counter, and the read out transistor.

6. The imaging system of claim 5 wherein the gated diode includes:
    a diffusion region of the second conductivity type formed in the second well;
    an inversion region defined in the second well, the inversion region adjoining the diffusion region;
    a layer of oxide formed over the inversion region; and
    a diode gate formed on the layer of oxide layer.

7. The imaging system of claim 6 wherein the read out transistor includes:
    spaced-apart source and drain regions formed in the second well, the source and drain regions being spaced apart from the diffusion region and the inversion region;
    a channel region defined in the second well between the source and drain regions;
    a layer of gate oxide formed over the channel region; and
    a read out gate formed on the layer of gate oxide over the channel region.

8. The imaging system of claim 6 wherein the oscillator is connected to the diode gate of the gated diode.

9. The imaging system of claim 6 wherein the counter is connected to the diode gate of the gated diode.

10. The imaging system of claim 6 wherein the cell diode is connected between the diffusion region and ground.

11. The imaging system of claim 5 wherein the oscillator outputs a series of pulses when commanded by the controller, and stops outputting the pulses when commanded by the controller.

12. The imaging system of claim 5 wherein the counter resets a count when commanded by the controller, counts a number of pulses output by the oscillator, and reset the count when commanded by the controller.

13. The imaging system of claim 5 wherein the pixel cell further comprises a select transistor connected to the source region and the controller.

14. The imaging system of claim 5 wherein the pixel cell further comprises:
   a variable voltage source; and
   a reset transistor connected to the second well and the variable voltage source.

15. A method for operating a pixel cell formed in a semiconductor material of a first conductivity type, the cell comprising:
   a first well of a second conductivity type formed in the semiconductor material;
   a second well of the first conductivity type formed in the first well;
   a gated diode formed in the second well; and
   a read out transistor formed in the second well, the read out transistor being spaced apart from the gated diode; and
   a cell diode connected between the gated diode and ground,
   the method comprising the steps of:
      setting a potential on the second well to a first level;
      collecting a plurality of photons in the first and second wells, the plurality of photons changing the potential on the second well to a second level; and
      applying a number of pulses to the gated diode until the potential on the second well returns to the first level;
      counting the number of pulses applied to the gated diode that are required to return the potential on the second well to the first level.

16. The method of claim 15 wherein the gated diode includes:
   a diffusion region of the second conductivity type formed in the second well;
   an inversion region defined in the second well, the inversion region adjoining the diffusion region;
   a layer of oxide formed over the inversion region; and
   a diode gate formed on the layer of oxide layer; and
   wherein the number of pulses are applied to the diode gate.

17. The method of claim 16 wherein the step of counting pulses is stopped when the current flowing out of the source region is equal to the predefined current after the potential on the second well has changed to the second level.

18. The method of claim 15 wherein the read out transistor includes:
   spaced-apart source and drain regions formed in the second well, the source and drain regions being spaced apart from the diffusion region and the inversion region;
   a channel region defined in the second well between the source and drain regions;
   a layer of gate oxide formed over the channel region; and
   a read out gate formed on the layer of gate oxide over the channel region; and
   wherein a bias voltage is applied to the drain and read out gate such that a predefined current flows out of the source region when the potential on the second well is at the first level.

19. The method of claim 18 wherein the predefined current is substantially zero.

20. A device comprising:
   a semiconductor material of a first conductivity type;
   a first well of a second conductivity type formed in the semiconductor material;
   a second well of the first conductivity type formed in the first well;
   a gated diode having a layer of first material formed on the second well and a diode gate formed on the layer of first material;
   a first transistor formed in the second well, the first transistor being spaced apart from the gated diode, the first transistor having a source region and a drain region formed in the second well, the source region being spaced apart from the drain region; and
   a cell diode connected between the gated diode and ground.

21. The device of claim 20 and further comprising:
   an oscillator connected to the gated diode;
   a counter connected to the gated diode; and
   a controller connected to the oscillator, the counter, and the first transistor.

22. The device of claim 21
   wherein the gated diode further has:
      a diffusion region of the second conductivity type formed in the second well, the diffusion region being spaced apart from the source region and the drain region; and
      an inversion region defined in the second well below the layer of first material, the inversion region adjoining the diffusion region; and
   wherein the cell diode is connected between the diffusion region and ground.

23. The device of claim 21 wherein the oscillator is connected to the diode gate.

24. The device of claim 23 wherein the counter is connected to the diode gate.

25. The device of claim 21 wherein the counter is connected to the diode gate.

26. The device of claim 21 wherein the oscillator outputs a series of pulses when commanded by the controller, and stops outputting the pulses when commanded by the controller.

27. The device of claim 26 wherein the counter resets a count when commanded by the controller, counts a number of pulses output by the oscillator, and resets the count when commanded by the controller.

28. The device of claim 21 wherein the counter resets a count when commanded by the controller, counts a number of pulses output by the oscillator, and resets the count when commanded by the controller.

29. The device of claim 21 and further comprising a second transistor connected to the source region and the controller.

30. The device of claim 21 and further comprising:
   a variable voltage source; and
   a second transistor connected to the second well and the variable voltage source.

* * * * *

UNITED STATES PATENT AND TRADEMARK OFFICE
CERTIFICATE OF CORRECTION

PATENT NO.   : 6,380,571 B1
DATED        : April 30, 2002
INVENTOR(S)  : Kalnitsky et al.

It is certified that error appears in the above-identified patent and that said Letters Patent is hereby corrected as shown below:

<u>Title page,</u>
Item [56], OTHER PUBLICATIONS insert -- Kalnitsky, A. et al., "Experimental Investigation of N-MOS Inversion Layers in the Electric Quantum Limit", Journal of Electronic Materials, Vol. 21, 1992, No. 3, pp. 367-372. --

<u>Drawings,</u>
Please delete drawing sheet Figure 5 and insert with replacement drawing sheet Figure 5.

Signed and Sealed this

Third Day of September, 2002

*Attest:*

*Attesting Officer*

JAMES E. ROGAN
*Director of the United States Patent and Trademark Office*

FIG. 5